United States Patent
Kim et al.

(10) Patent No.: US 10,459,560 B2
(45) Date of Patent: Oct. 29, 2019

(54) TOUCH INPUT DEVICE CAPABLE OF DETECTING TOUCH PRESSURE AND COMPRISING DISPLAY MODULE

(71) Applicant: HiDeep Inc., Gyeonggi-do (KR)

(72) Inventors: Tae Hwan Kim, Gyeonggi-do (KR); Bon Kee Kim, Gyeonggi-do (KR)

(73) Assignee: HIDEEP INC. (KR)

( * ) Notice: Subject to any disclaimer, the term of this patent is extended or adjusted under 35 U.S.C. 154(b) by 0 days.

(21) Appl. No.: 15/758,508

(22) PCT Filed: Sep. 6, 2016

(86) PCT No.: PCT/KR2016/009938
§ 371 (c)(1),
(2) Date: Mar. 8, 2018

(87) PCT Pub. No.: WO2017/043829
PCT Pub. Date: Mar. 16, 2017

(65) Prior Publication Data
US 2018/0246611 A1     Aug. 30, 2018

(30) Foreign Application Priority Data
Sep. 9, 2015   (KR) .................. 10-2015-0127566

(51) Int. Cl.
G06F 3/041     (2006.01)
G06F 3/044     (2006.01)
(Continued)

(52) U.S. Cl.
CPC ........ G06F 3/0414 (2013.01); G02F 1/13338 (2013.01); G06F 3/044 (2013.01);
(Continued)

(58) Field of Classification Search
CPC .................. G06F 3/0414; G06F 3/03547
(Continued)

(56) References Cited

U.S. PATENT DOCUMENTS 6,002,389 A    12/1999  Kasser
7,649,527 B2 *  1/2010  Cho .................. G02F 1/1354
                                                345/175
(Continued)

FOREIGN PATENT DOCUMENTS

CN        104145240         11/2014
JP        2008281616        11/2008
(Continued)

OTHER PUBLICATIONS

Corresponding European Search Report issued by EOP dated May 29, 2018.
(Continued)

*Primary Examiner* — Roy P Rabindranath
(74) *Attorney, Agent, or Firm* — The Belles Group, P.C.

(57) ABSTRACT

A touch input device detecting a touch position and a touch pressure includes a display module having a first layer made of glass or plastic and a second layer disposed under the first layer and made of glass or plastic; touch electrodes formed within the display module for detecting the touch position and the touch pressure; and a reference electrode disposed apart from the touch electrode. The touch position is detected by a sensing signal received from the touch electrode. An electrical signal changed by a capacitance between the touch electrode and the reference electrode is detected from the touch electrode. The capacitance is changed by change of a distance between the touch electrode and the reference electrode. The distance between the touch electrode and the reference electrode is changed by the bending of the display module. The touch pressure is detected based on the capacitance.

11 Claims, 8 Drawing Sheets

(51) Int. Cl.
  *G02F 1/1333* (2006.01)
  *H01L 27/32* (2006.01)
(52) U.S. Cl.
  CPC .......... *G06F 3/0412* (2013.01); *H01L 27/323* (2013.01); *G06F 2203/04105* (2013.01); *G06F 2203/04107* (2013.01)
(58) Field of Classification Search
  USPC .................................................. 345/173–178
  See application file for complete search history.

(56) References Cited

U.S. PATENT DOCUMENTS

| | | | |
|---|---|---|---|
| 8,552,989 | B2 | 10/2013 | Hotelling et al. |
| 9,201,105 | B2 | 12/2015 | Iida et al. |
| 9,507,456 | B2 | 11/2016 | Watazu et al. |
| 2003/0010894 | A1 | 1/2003 | Yoshihara |
| 2007/0095148 | A1 | 5/2007 | Takahashi |
| 2008/0062139 | A1 | 3/2008 | Hotelling et al. |
| 2008/0278458 | A1 | 11/2008 | Masuzawa et al. |
| 2011/0181548 | A1 | 7/2011 | Sekipethi |
| 2013/0018489 | A1 | 1/2013 | Grunthaner et al. |
| 2013/0020573 | A1* | 1/2013 | Fukuyama ............... G01L 1/146 257/53 |
| 2013/0234734 | A1 | 9/2013 | Iida et al. |
| 2013/0257784 | A1 | 10/2013 | Vandermeijden et al. |
| 2013/0265256 | A1* | 10/2013 | Nathan ................. G06F 3/0414 345/173 |
| 2015/0153869 | A1 | 6/2015 | Kim et al. |
| 2015/0153887 | A1* | 6/2015 | Kim ........................ G06F 3/044 345/173 |
| 2015/0153942 | A1 | 6/2015 | Kim et al. |
| 2015/0317012 | A1 | 11/2015 | Solven et al. |
| 2015/0378491 | A1 | 12/2015 | Worfolk et al. |
| 2016/0041648 | A1 | 2/2016 | Richards |
| 2016/0062500 | A1 | 3/2016 | Kessler et al. |
| 2016/0085336 | A1* | 3/2016 | Kim ...................... G06F 1/1643 345/174 |
| 2016/0092015 | A1 | 3/2016 | Al-Dahle et al. |
| 2016/0216833 | A1 | 7/2016 | Butler et al. |
| 2016/0253019 | A1 | 9/2016 | Geaghan |
| 2016/0334903 | A1 | 11/2016 | Shepelev |
| 2017/0045967 | A1 | 2/2017 | Li et al. |
| 2017/0068383 | A1 | 3/2017 | Chern et al. |

FOREIGN PATENT DOCUMENTS

| | | |
|---|---|---|
| JP | 2011154512 | 8/2011 |
| JP | 2012079135 | 4/2012 |
| JP | 2014186711 | 10/2014 |
| JP | 2015109086 | 6/2015 |
| JP | 5798700 | 8/2015 |
| JP | 2015143978 | 8/2015 |
| JP | 2013257898 | 12/2015 |
| KR | 1020120049787 | 5/2012 |
| KR | 1020130110707 | 10/2013 |
| KR | 1020140006213 | 1/2014 |
| KR | 1020150062714 | 6/2015 |
| WO | WO9740482 | 10/1997 |
| WO | 2015106183 | 7/2015 |

OTHER PUBLICATIONS

Office Action from the USPTO for related matter in U.S. Appl. No. 15/257,997 dated Sep. 12, 2018.
Corresponding International Search Report for PCT/KR2016/009938 dated Dec. 23, 2016.
Final Office Action dated Feb. 6, 2018 in Corresponding JP 2016-174757. JP.
Chinese Office Action dated Oct. 18, 2018.

\* cited by examiner

RX_p  10  20

30   RX_p

TOUCH INPUT DEVICE CAPABLE OF DETECTING TOUCH PRESSURE AND COMPRISING DISPLAY MODULE

CROSS-REFERENCE TO RELATED PATENT APPLICATIONS

The present application is a U.S. national stage application under 35 U.S.C. § 371 of PCT Application No. PCT/KR2016/009938, filed Sep. 6, 2016, which claims priority to Korean Patent Application No. 10-2015-0127566, filed Sep. 9, 2015. The disclosures of the aforementioned priority applications are incorporated herein by reference in their entireties.

TECHNICAL FIELD

The present disclosure relates to a touch pressure detectable touch input device including a display module, and more particularly to a touch pressure detectable touch input device including a display module capable of detecting a touch position and a touch pressure by using a capacitance change amount.

BACKGROUND ART

Various kinds of input devices are being used to operate a computing system. For example, the input device includes a button, key, joystick and touch screen. Since the touch screen is easy and simple to operate, the touch screen is increasingly being used in operation of the computing system.

The touch screen may constitute a touch surface of a touch input device including a touch sensor panel which may be a transparent panel including a touch-sensitive surface. The touch sensor panel is attached to the front side of a display screen, and then the touch-sensitive surface may cover the visible side of the display screen. The touch screen allows a user to operate the computing system by simply touching the touch screen by a finger, etc. Generally, the computing system recognizes the touch and a position of the touch on the touch screen and analyzes the touch, and thus, performs the operations in accordance with the analysis.

Here, there is a demand for a touch input device capable of detecting not only the touch position according to the touch on the touch screen but a pressure magnitude of the touch without degrading the performance of a display module.

DISCLOSURE

Technical Problem

The purpose of the present invention is to provide a touch pressure detectable touch input device including a display module. Also, the purpose of the present invention is to provide touch pressure detectable touch input device which not only includes a display module but also has a thinner thickness and a reduced manufacturing cost.

Another purpose of the present invention is to provide a touch pressure detectable touch input device which includes a display module, without degrading visibility and light transmittance of the display module.

Technical Solution

One embodiment is a touch input device detecting a touch position and a touch pressure. The touch input device includes: a display module which includes a first layer made of glass or plastic and a second layer which is disposed under the first layer and is made of glass or plastic; a plurality of touch electrodes which are formed within the display module and are for detecting the touch position and the touch pressure; and a reference electrode which is disposed apart from the touch electrode. A drive signal is applied to the touch electrode and the touch position is detected by a sensing signal received from the touch electrode. An electrical signal which is changed by a capacitance between the touch electrode and the reference electrode is detected from the touch electrode. The capacitance is changed by change of a distance between the touch electrode and the reference electrode. The distance between the touch electrode and the reference electrode is changed by the bending of the display module. The touch pressure is detected based on the capacitance.

Another embodiment is a touch input device detecting a touch position and a touch pressure. The touch input device includes: a display module which includes a first layer made of glass or plastic and a second layer which is disposed under the first layer and is made of glass or plastic; a plurality of touch electrodes which are formed within the display module and are for detecting the touch position and the touch pressure; and a reference electrode which is disposed apart from the touch electrode. A drive signal is applied to the touch electrode and the touch position is detected by a sensing signal received from the touch electrode. The plurality of touch electrodes include a first electrode and a second electrode. An electrical signal which is changed by a capacitance between the first electrode and the second electrode is detected from the first electrode or the second electrode. The capacitance is changed by change of a distance between the touch electrode and the reference electrode. The distance between the touch electrode and the reference electrode is changed by the bending of the display module. The touch pressure is detected based on the capacitance.

The touch input device may further include: a substrate which is disposed under the display module; and a spacer layer which is disposed between the touch electrode and the reference electrode. A spacer layer retaining member having a predetermined thickness may be formed along the circumference of the upper portion of the substrate in order to retain the spacer layer. When the display module is bent by applying a pressure to the display module, the spacer layer retaining member may not be transformed. The reference electrode may be the substrate.

A liquid crystal layer may be disposed between the first layer and the second layer.

An organic material layer may be disposed between the first layer and the second layer.

The touch electrode may be formed on the top surface of the first layer.

The touch electrode may be formed on the bottom surface of the first layer or on the top surface of the second layer.

The touch electrode may be a common electrode included in the display module.

The reference electrode may be disposed within the display module.

The touch electrode may form a plurality of channels.

The touch input device can detect multi pressure according to multi touch by using the plurality of channels.

Further another embodiment is a touch input device detecting a touch position and a touch pressure. The touch input device includes: a display module which includes a first layer made of glass or plastic and a second layer which is disposed under the first layer and is made of glass or plastic; a first electrode for detecting the touch position and the touch pressure and a second electrode for detecting the touch position, which are formed within the display module; and a reference electrode which is disposed apart from the first electrode. A drive signal is applied to the first electrode, and the touch position is detected by a sensing signal received from the second electrode. An electrical signal which is changed by a capacitance between the first electrode and the reference electrode is detected from the first electrode. The capacitance is changed by change of a distance between the first electrode and the reference electrode. The distance between the first electrode and the reference electrode is changed by the bending of the display module. Touch pressure is detected based on the capacitance.

The touch input device may further include: a substrate which is disposed under the display module; and a spacer layer which is disposed between the first electrode and the reference electrode. A spacer layer retaining member having a predetermined thickness may be formed along the circumference of the upper portion of the substrate in order to retain the spacer layer. When the display module is bent by applying a pressure to the display module, the spacer layer retaining member may not be transformed. The reference electrode may be the substrate.

Yet another embodiment is a touch input device detecting a touch position and a touch pressure. The touch input device includes: a display module which includes a first layer made of glass or plastic and a second layer which is disposed under the first layer and is made of glass or plastic; a first electrode for detecting the touch position and a second electrode for detecting the touch position and the touch pressure, which are formed within the display module; and a reference electrode which is disposed apart from the second electrode. A drive signal is applied to the first electrode, and the touch position is detected by a sensing signal received from the second electrode. An electrical signal which is changed by a capacitance between the second electrode and the reference electrode is detected from the second electrode. The capacitance is changed by change of a distance between the second electrode and the reference electrode. The distance between the second electrode and the reference electrode is changed by the bending of the display module. The touch pressure is detected based on the capacitance. And, wherein the display module further includes a liquid crystal layer, and the first layer and the second layer are provided on upper and lower portions of the liquid crystal layer respectively, wherein the second electrode within the liquid crystal layer is formed on one side of the second glass layer and the reference electrode within the liquid crystal layer is formed on the other side of the first glass layer.

The touch input device may further include: a substrate which is disposed under the display module; and a spacer layer which is disposed between the second electrode and the reference electrode. A spacer layer retaining member having a predetermined thickness may be formed along the circumference of the upper portion of the substrate in order to retain the spacer layer. When the display module is bent by applying a pressure to the display module, the spacer layer retaining member may not be transformed. The reference electrode may be the substrate.

Still another embodiment is a touch input device detecting a touch position and a touch pressure. The touch input device includes: a display module which includes a first layer made of glass or plastic and a second layer which is disposed under the first layer and is made of glass or plastic; a first electrode for detecting the touch position and the touch pressure and a second electrode for detecting the touch position and the touch pressure, which are formed within the display module; and a reference electrode which is disposed apart from the first electrode and the second electrode. A drive signal is applied to the first electrode, and the touch position is detected by a sensing signal received from the second electrode. An electrical signal which is changed by a capacitance between the first electrode and the second electrode is detected from the first electrode or the second electrode. The capacitance is changed by change of a distance between the reference electrode and both the first electrode and the second electrode. The distance between the reference electrode and both the first electrode and the second electrode is changed by the bending of the display module. The touch pressure is detected based on the capacitance.

The touch input device may further include: a substrate which is disposed under the display module; and a spacer layer which is disposed between the reference electrode and both the first electrode and the second electrode. A spacer layer retaining member having a predetermined thickness may be formed along the circumference of the upper portion of the substrate in order to retain the spacer layer. When the display module is bent by applying a pressure to the display module, the spacer layer retaining member may be not transformed. The reference electrode may be the substrate.

A liquid crystal layer may be disposed between the first layer and the second layer.

An organic material layer may be disposed between the first layer and the second layer.

The first electrode and the second electrode may be formed on the top surface of the first layer.

The first electrode and the second electrode may be formed on the bottom surface of the first layer or on the top surface of the second layer.

The first electrode or the second electrode may be a common electrode included in the display module.

The first electrode may be formed on the top surface of the first layer, and the second electrode may be formed on the bottom surface of the first layer or on the top surface of the second layer.

The second electrode may be a common electrode included in the display module.

The second electrode may be formed on the top surface of the first layer, and the first electrode may be formed on the bottom surface of the first layer or on the top surface of the second layer.

The first electrode may be a common electrode included in the display module.

The reference electrode may be disposed within the display module.

At least one of the first electrode and the second electrode may form a plurality of channels.

The touch input device can detect multi pressure according to multi touch by using the plurality of channels.

Advantageous Effects

According to the thus configured touch pressure detectable display module, the touch input device, and the touch pressure detection method using the same, the touch input device can have a thinner thickness and a reduced manufacturing cost, without degrading visibility and light transmittance of the display module, and can detect the touch position and the touch pressure. Also, the touch position and the touch pressure can be detected simultaneously.

MODE FOR INVENTION

Figure 1A:
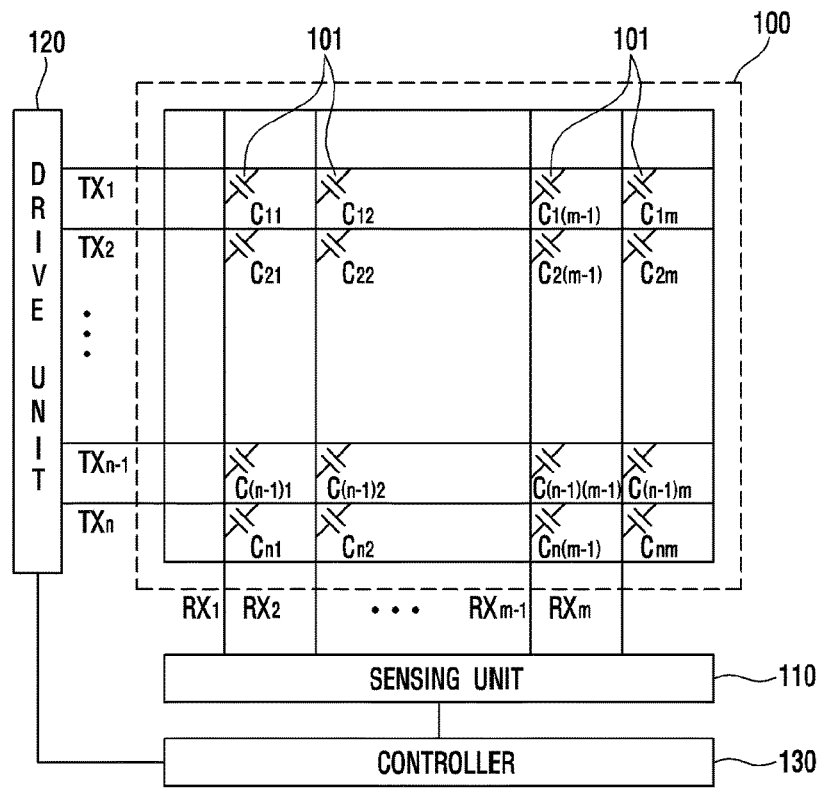
FIG. 1a is a schematic view for describing a capacitance type touch sensor panel 100 and the operation thereof in accordance with an embodiment of the present invention.

Specific embodiments of the present invention will be described in detail with reference to the accompanying drawings. The specific embodiments shown in the accompanying drawings will be described in enough detail that those skilled in the art are able to embody the present invention. Other embodiments other than the specific embodiments are mutually different, but do not have to be mutually exclusive. Additionally, it should be understood that the following detailed description is not intended to be limited.

The detailed descriptions of the specific embodiments shown in the accompanying drawings are intended to be read in connection with the accompanying drawings, which are to be considered part of the entire written description. Any reference to direction or orientation is merely intended for convenience of description and is not intended in any way to limit the scope of the present invention.

Specifically, relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation.

Terms such as "attached," "affixed," "connected," "coupled," "interconnected," and similar refer to a relationship wherein structures are attached, connected or fixed to one another either directly or indirectly through intervening structures, as well as both movable or rigid attachments or relationships, unless expressly described otherwise.

A touch input device according to the embodiment of the present invention can be used not only in a portable electronic product such as a smartphone, smartwatch, tablet PC, laptop computer, personal digital assistant (PDA), MP3 player, camera, camcorder, electronic dictionary, etc., but also in an electric home appliance such as a home PC, TV, DVD, refrigerator, air conditioner, microwave, etc. Also, the touch pressure detectable touch input device including a display module in accordance with the embodiment of the present invention can be used without limitation in all of the products requiring a device for display and input such as an industrial control device, a medical device, etc.

A touch input device according to an embodiment of the present invention will be described with reference to the accompanying drawings. While a capacitance type touch sensor panel 100 and a pressure detection module 400 are described below, the touch sensor panel 100 and the pressure detection module 400 may be adopted, which are capable of detecting a touch position and/or touch pressure by any method.

FIG. 1a is a schematic view for describing the capacitance type touch sensor panel 100 and the operation thereof in accordance with an embodiment of the present invention. Referring to FIG. 1a, the touch sensor panel 100 according to the embodiment of the present invention may include a plurality of drive electrodes TX1 to TXn and a plurality of receiving electrodes RX1 to RXm, and may include a drive unit 120 which applies a drive signal to the plurality of drive electrodes TX1 to TXn for the purpose of the operation of the touch sensor panel 100, and a sensing unit 110 which detects the touch and the touch position by receiving a sensing signal including information on a capacitance change amount changing according to the touch on the touch surface of the touch sensor panel 100.

As shown in FIG. 1a, the touch sensor panel 100 may include the plurality of drive electrodes TX1 to TXn and the plurality of receiving electrodes RX1 to RXm. FIG. 1a shows that the plurality of drive electrodes TX1 to TXn and the plurality of receiving electrodes RX1 to RXm of the touch sensor panel 100 form an orthogonal array.

Figure 1B:
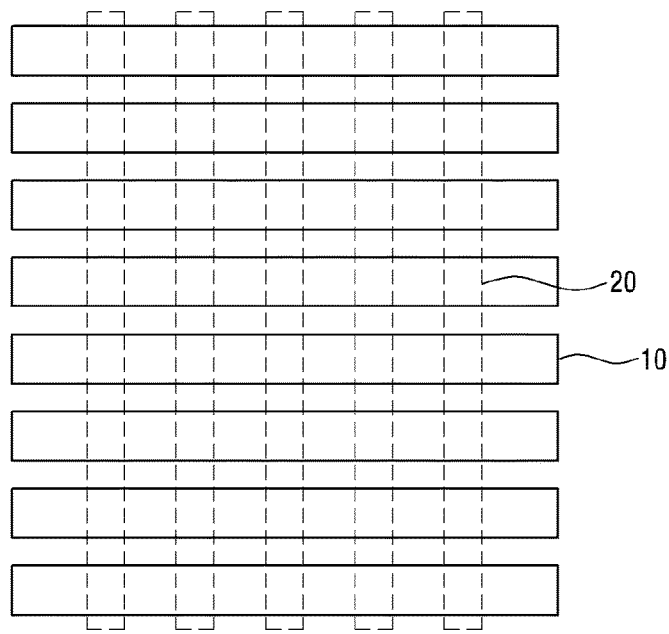
FIGS. 1b and 1c show various arrangements of a plurality of drive electrodes and a plurality of receiving electrodes in accordance with the embodiment of the present invention.
Figure 1C:
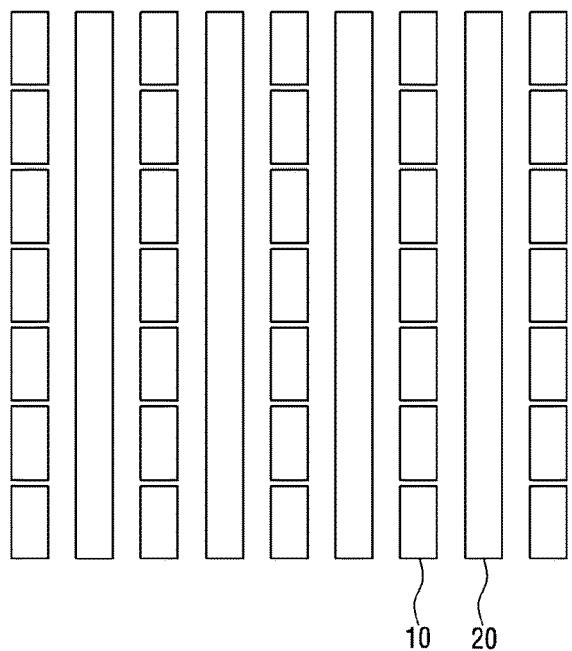

FIGS. 1b and 1c show various arrangements of the plurality of drive electrodes and the plurality of receiving electrodes in accordance with the embodiment of the present invention. FIG. 1b shows that a drive electrode 10 and a receiving electrode 20 which have been disposed in separate layers form an orthogonal array. That is, the receiving electrode 20 may be extended in a direction crossing the direction in which the drive electrode 10 is extended. FIG.

1c shows that the drive electrode 10 and the receiving electrode 20 have been disposed in the same layer. In this case, the receiving electrode 20 may be extended in parallel with the direction in which the drive electrode 10 is extended.

However, the present invention is not limited to this. The plurality of drive electrodes 10 and the plurality of receiving electrodes 20 has an array of arbitrary dimension, for example, a diagonal array, a concentric array, a 3-dimensional random array, etc., and an array obtained by the application of them. Here, "n" and "m" are positive integers and may be the same as each other or may have different values. The magnitude of the value may be changed depending on the embodiment.

As shown in FIGS. 1a and 1b, the plurality of drive electrodes TX1 to TXn and the plurality of receiving electrodes RX1 to RXm may be arranged to cross each other. The drive electrode TX may include the plurality of drive electrodes TX1 to TXn extending in a first axial direction. The receiving electrode RX may include the plurality of receiving electrodes RX1 to RXm extending in a second axial direction crossing the first axial direction.

In the touch sensor panel 100 according to the embodiment of the present invention, the plurality of drive electrodes TX1 to TXn and the plurality of receiving electrodes RX1 to RXm may be formed in the same layer. For example, the plurality of drive electrodes TX1 to TXn and the plurality of receiving electrodes RX1 to RXm may be formed on the same side of an insulation layer (not shown). Also, the plurality of drive electrodes TX1 to TXn and the plurality of receiving electrodes RX1 to RXm may be formed in the different layers. For example, the plurality of drive electrodes TX1 to TXn and the plurality of receiving electrodes RX1 to RXm may be formed on both sides of one insulation layer (not shown) respectively, or the plurality of drive electrodes TX1 to TXn may be formed on a side of a first insulation layer (not shown) and the plurality of receiving electrodes RX1 to RXm may be formed on a side of a second insulation layer (not shown) different from the first insulation layer.

The plurality of drive electrodes TX1 to TXn and the plurality of receiving electrodes RX1 to RXm may be made of a transparent conductive material (for example, indium tin oxide (ITO) or antimony tin oxide (ATO) which is made of tin oxide ($SnO_2$), and indium oxide ($In_2O_3$), etc.), or the like. However, this is only an example. The drive electrode TX and the receiving electrode RX may be also made of another transparent conductive material or an opaque conductive material. For instance, the drive electrode TX and the receiving electrode RX may be formed to include at least any one of silver ink, copper or carbon nanotube (CNT). Also, the drive electrode TX and the receiving electrode RX may be made of metal mesh or nano silver.

The drive unit 120 according to the embodiment of the present invention may apply a drive signal to the drive electrodes TX1 to TXn. In the embodiment of the present invention, one drive signal may be sequentially applied at a time to the first drive electrode TX1 to the n-th drive electrode TXn. The drive signal may be applied again repeatedly. This is only an example. The drive signal may be applied to the plurality of drive electrodes at the same time in accordance with the embodiment.

Through the receiving electrodes RX1 to RXm, the sensing unit 110 receives the sensing signal including information on a capacitance (Cm) 101 generated between the receiving electrodes RX1 to RXm and the drive electrodes TX1 to TXn to which the drive signal has been applied, thereby detecting whether or not the touch has occurred and where the touch has occurred. For example, the sensing signal may be a signal coupled by the capacitance (CM) 101 generated between the receiving electrode RX and the drive electrode TX to which the drive signal has been applied. As such, the process of sensing the drive signal applied from the first drive electrode TX1 to the n-th drive electrode TXn through the receiving electrodes RX1 to RXm can be referred to as a process of scanning the touch sensor panel 100.

For example, the sensing unit 110 may include a receiver (not shown) which is connected to each of the receiving electrodes RX1 to RXm through a switch. The switch becomes the on-state in a time interval during which the signal of the corresponding receiving electrode RX is sensed, thereby allowing the receiver to sense the sensing signal from the receiving electrode RX. The receiver may include an amplifier (not shown) and a feedback capacitor coupled between the negative (−) input terminal of the amplifier and the output terminal of the amplifier, i.e., coupled to a feedback path. Here, the positive (+) input terminal of the amplifier may be connected to the ground. Also, the receiver may further include a reset switch which is connected in parallel with the feedback capacitor. The reset switch may reset the conversion from current to voltage that is performed by the receiver. The negative input terminal of the amplifier is connected to the corresponding receiving electrode RX and receives and integrates a current signal including information on the capacitance (CM) 101, and then converts the integrated current signal into voltage. The sensing unit 110 may further include an analog to digital converter (ADC) (not shown) which converts the integrated data by the receiver into digital data. Later, the digital data may be input to a processor (not shown) and processed to obtain information on the touch on the touch sensor panel 100. The sensing unit 110 may include the ADC and processor as well as the receiver.

A controller 130 may perform a function of controlling the operations of the drive unit 120 and the sensing unit 110. For example, the controller 130 generates and transmits a drive control signal to the drive unit 120, so that the drive signal can be applied to a predetermined drive electrode TX1 for a predetermined time period. Also, the controller 130 generates and transmits the drive control signal to the sensing unit 110, so that the sensing unit 110 may receive the sensing signal from the predetermined receiving electrode RX for a predetermined time period and perform a predetermined function.

In FIG. 1a, the drive unit 120 and the sensing unit 110 may constitute a touch detection device (not shown) capable of detecting whether the touch has occurred on the touch sensor panel 100 according to the embodiment of the present invention or not and where the touch has occurred. The touch detection device according to the embodiment of the present invention may further include the controller 130. The touch detection device according to the embodiment of the present invention may be integrated and implemented on a touch sensing integrated circuit IC in a touch input device 1000 including the touch sensor panel 100. The drive electrode TX and the receiving electrode RX included in the touch sensor panel 100 may be connected to the drive unit 120 and the sensing unit 110 included in touch sensing IC (not shown) through, for example, a conductive trace and/or a conductive pattern printed on a circuit board, or the like. The touch sensing IC may be placed on a circuit board on which the conductive pattern has been printed, for example, a first printed circuit board (hereafter, referred to as a first PCB). According to the embodiment, the touch sensing IC (not shown) may be mounted on a main board for operation of the touch input device 1000.

As described above, a capacitance (C) with a predetermined value is formed at each crossing of the drive electrode TX and the receiving electrode RX. When an object U such as a finger, palm, stylus, etc., approaches close to the touch sensor panel 100, the value of the capacitance may be changed. In FIG. 1*a*, the capacitance may represent a mutual capacitance (Cm). The sensing unit 110 senses such electrical characteristics, thereby detecting whether the touch has occurred on the touch sensor panel 100 or not and where the touch has occurred. For example, the sensing unit 110 is able to detect whether the touch has occurred on the surface of the touch sensor panel 100 comprised of a two-dimensional plane consisting of a first axis and a second axis.

More specifically, when the touch occurs on the touch sensor panel 100, the drive electrode TX to which the drive signal has been applied is detected, so that the position of the second axial direction of the touch can be detected. Likewise, when the touch occurs on the touch sensor panel 100, the capacitance change is detected from the reception signal received through the receiving electrode RX, so that the position of the first axial direction of the touch can be detected.

The touch sensor panel 100 for detecting where the touch has occurred in the touch input device 1000 according to the embodiment of the present invention may be positioned outside or inside a display module 200.

The display module of the touch input device 1000 according to the embodiment of the present invention may be a display panel included in a liquid crystal display (LCD), a plasma display panel (PDP), an organic light emitting diode (OLED), etc. Accordingly, a user may perform the input operation by touching the touch surface while visually identifying an image displayed on the display panel. Here, the display module 200 may include a control circuit which receives an input from an application processor (AP) or a central processing unit (CPU) on a main board for the operation of the touch input device 1000 and displays the contents that the user wants on the display panel. The control circuit may be mounted on a second printed circuit board (hereafter, referred to as a second PCB). Here, the control circuit for the operation of the display module 200 may include a display panel control IC, a graphic controller IC, and a circuit required to operate other display modules 200.

While the foregoing has described the operation of the touch sensor panel 100 detecting the touch position on the basis of a mutual capacitance change amount between the drive electrode TX and the receiving electrode RX, the present invention is not limited to this. That is, as shown in FIG. 2, it is possible to detect the touch position on the basis of a self-capacitance change amount.

Figure 2:
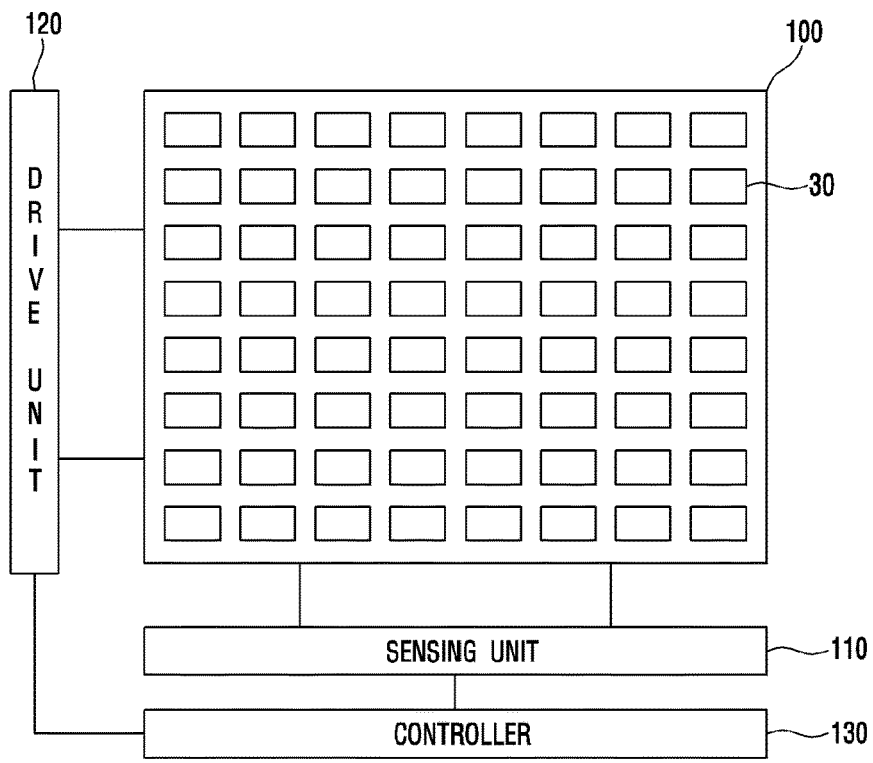
FIG. 2 is a schematic view for describing a capacitance type touch sensor panel 100 and the operation thereof in accordance with another embodiment of the present invention.

FIG. 2 is a schematic view for describing a capacitance type touch sensor panel 100 and the operation thereof in accordance with another embodiment of the present invention. A plurality of touch electrodes 30 are provided on the touch sensor panel 100 shown in FIG. 2. Although the plurality of touch electrodes 30 may be, as shown in FIG. 2, disposed at a regular interval in the form of a grid, the present invention is not limited to this.

The drive control signal generated by the controller 130 is transmitted to the drive unit 120. On the basis of the drive control signal, the drive unit 120 applies the drive signal to the predetermined touch electrode 30 for a predetermined time period. Also, the drive control signal generated by the controller 130 is transmitted to the sensing unit 110. On the basis of the drive control signal, the sensing unit 110 receives the sensing signal from the predetermined touch electrode 30 for a predetermined time period. Here, the sensing signal may be a signal for the change amount of the self-capacitance formed on the touch electrode 30.

Here, whether the touch has occurred on the touch sensor panel 100 or not and/or the touch position are detected by the sensing signal detected by the sensing unit 110. For example, since the coordinate of the touch electrode 30 has been known in advance, whether the touch of the object U on the surface of the touch sensor panel 100 has occurred or not and/or the touch position can be detected.

The foregoing has described in detail the touch sensor panel 100 detecting the touch position on the basis of the mutual capacitance change amount and the self-capacitance change amount. However, in the touch input device 1000 according to the embodiment of the present invention, the touch sensor panel 100 for detecting whether or not the touch has occurred and the touch position may be implemented by using not only the above-described method but also any touch sensing method such as a surface capacitance type method, a projected capacitance type method, a resistance film method, a surface acoustic wave (SAW) method, an infrared method, an optical imaging method, a dispersive signal technology, and an acoustic pulse recognition method, etc.

FIGS. 3*a* to 3*e* are conceptual views showing a relative position of the touch sensor panel with respect to the display module in the touch input device according to the embodiment of the present invention.

First, a relative position of the touch sensor panel 100 with respect to the display module 200 using an LCD panel will be described with reference to FIGS. 3*a* to 3*c*.

In this specification, a reference numeral 200 designates the display module. However, the reference numeral 200 in FIGS. 3*a* to 3*e* and the descriptions thereof may designate a display panel as well as the display module.

Figure 3A:
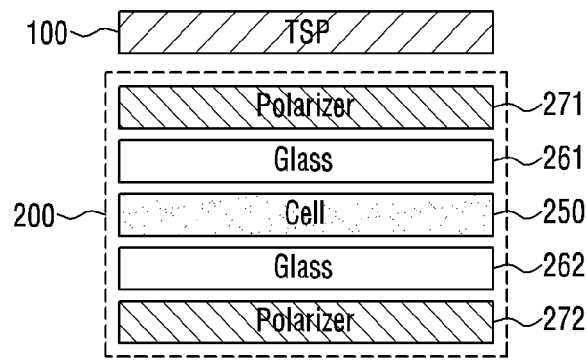
FIGS. 3a to 3e are conceptual views showing a relative position of the touch sensor panel with respect to a display module in a touch input device according to the embodiment of the present invention.
Figure 3B:
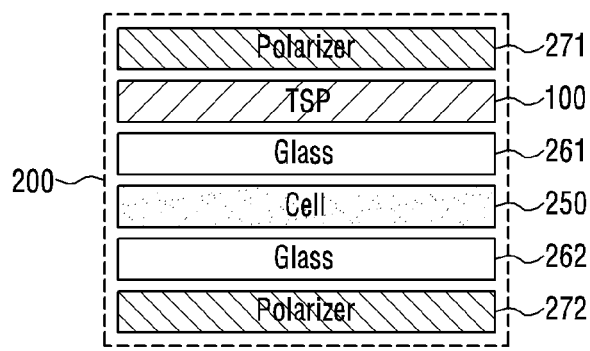
Figure 3C:
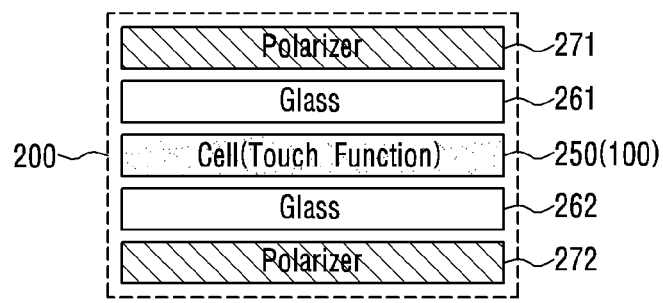

As shown in FIGS. 3*a* to 3*c*, the LCD panel may include a liquid crystal layer 250 including a liquid crystal cell, a first glass layer 261 and a second glass layer 262 which are disposed on both sides of the liquid crystal layer 250 and include electrodes, a first polarizer layer 271 formed on a side of the first glass layer 261 in a direction facing the liquid crystal layer 250, and a second polarizer layer 272 formed on a side of the second glass layer 262 in the direction facing the liquid crystal layer 250. Here, the first glass layer 261 may be color filter glass, and the second glass layer 262 may be TFT glass.

It is clear to those skilled in the art that the LCD panel may further include other configurations for the purpose of performing the displaying function and may be transformed.

FIG. 3*a* shows that the touch sensor panel 100 of the touch input device 1000 is disposed outside the display module 200. The touch surface of the touch input device 1000 may be the surface of the touch sensor panel 100. In FIG. 3*a*, the top surface of the touch sensor panel 100 is able to function as the touch surface. Also, according to the embodiment, the touch surface of the touch input device 1000 may be the outer surface of the display module 200. In FIG. 3*a*, the bottom surface of the second polarizer layer 272 of the display module 200 is able to function as the touch surface. Here, in order to protect the display module 200, the bottom surface of the display module 200 may be covered with a cover layer (not shown) like glass.

FIGS. 3*b* and 3*c* show that the touch sensor panel 100 of the touch input device 1000 is disposed inside the display module 200. Here, in FIG. 3*b*, the touch sensor panel 100 for detecting the touch position is disposed between the first glass layer 261 and the first polarizer layer 271. Here, the touch surface of the touch input device 1000 is the outer surface of the display module 200. The top surface or bottom surface of the display module 200 in FIG. 3*b* may be the touch surface. FIG. 2*c* shows that the touch sensor panel 100 for detecting the touch position is included in the liquid crystal layer 250. Here, the touch surface of the touch input device 1000 is the outer surface of the display module 200. The top surface or bottom surface of the display module 200 in FIG. 3*c* may be the touch surface. In FIGS. 3*b* and 3*c*, the top surface or bottom surface of the display module 200, which can be the touch surface, may be covered with a cover layer (not shown) like glass.

The foregoing has described whether the touch has occurred on the touch sensor panel 100 according to the embodiment of the present or not and where the touch has occurred. Further, through use of the touch sensor panel 100 according to the embodiment of the present, it is possible to detect the magnitude of the touch pressure as well as whether the touch has occurred or not and where the touch has occurred. Also, apart from the touch sensor panel 100, it is possible to detect the magnitude of the touch pressure by further including the pressure detection module which detects the touch pressure.

Figure 3D:
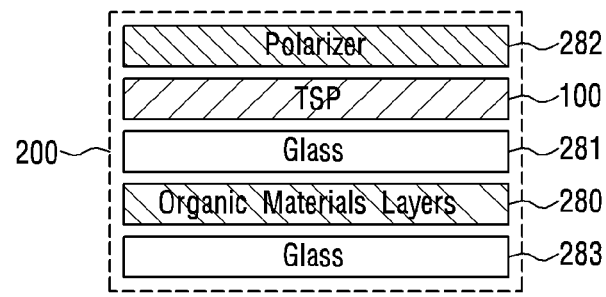
Figure 3E:
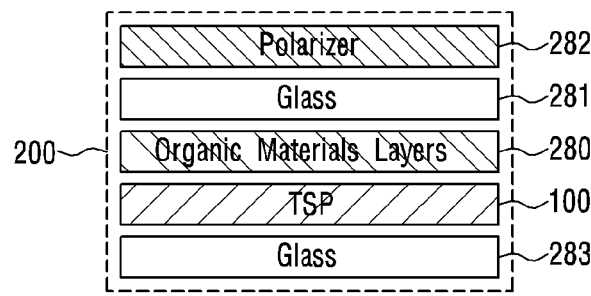

Next, a relative position of the touch sensor panel 100 with respect to the display module 200 using an OLED panel will be described with reference to FIGS. 3*d* and 3*e*. In FIG. 3*d*, the touch sensor panel 100 is positioned between a polarizer layer 282 and a first glass layer 281. In FIG. 3*e*, the touch sensor panel 100 is positioned between an organic material layer 280 and a second glass layer 283.

Here, the first glass layer 281 may be made of encapsulation glass. The second glass layer 283 may be made of TFT glass. Since the touch sensing has been described above, the other configurations only will be briefly described.

The OLED panel is a self-light emitting display panel which uses a principle where, when current flows through a fluorescent or phosphorescent organic thin film and then electrons and electron holes are combined in the organic material layer, so that light is generated. The organic matter constituting the light emitting layer determines the color of the light.

Specifically, the OLED uses a principle in which when electricity flows and an organic matter is applied on glass or plastic, the organic matter emits light. That is, the principle is that electron holes and electrons are injected into the anode and cathode of the organic matter respectively and are recombined in the light emitting layer, so that a high energy exciton is generated and the exciton releases the energy while falling down to a low energy state and then light with a particular wavelength is generated. Here, the color of the light is changed according to the organic matter of the light emitting layer.

The OLED includes a line-driven passive-matrix organic light-emitting diode (PM-OLED) and an individual driven active-matrix organic light-emitting diode (AM-OLED) in accordance with the operating characteristics of a pixel constituting a pixel matrix. None of them require a backlight. Therefore, the OLED enables a very thin display module to be implemented, has a constant contrast ratio according to an angle and obtains a good color reproductivity depending on a temperature. Also, it is very economical in that non-driven pixel does not consume power.

In terms of operation, the PM-OLED emits light only during a scanning time at a high current, and the AM-OLED maintains a light emitting state only during a frame time at a low current. Therefore, the AM-OLED has a resolution higher than that of the PM-OLED and is advantageous for driving a large area display panel and consumes low power. Also, a thin film transistor (TFT) is embedded in the AM-OLED, and thus, each component can be individually controlled, so that it is easy to implement a delicate screen.

As shown in FIGS. 3*d* and 3*e*, basically, the OLED (particularly, AM-OLED) panel includes the polarizer layer 282, the first glass layer 281, the organic layer 280, and the second glass layer 283. Here, the first glass layer 281 may be made of encapsulation glass. The second glass layer 283 may be made of TFT glass. However, they are not limited to this.

Also, the organic layer 280 may include a hole injection layer (HIL), a hole transport layer (HTL), an electron injection layer (EIL), an electron transport layer (ETL), and an light-emitting layer (EML).

Briefly describing each of the layers, HIL injects electron holes and is made of a material such as CuPc, etc. HTL functions to move the injected electron holes and mainly is made of a material having a good hole mobility. Arylamine, TPD, and the like may be used as the HTL. The EIL and ETL inject and transport electrons. The injected electrons and electron holes are combined in the EML and emit light. The EML represents the color of the emitted light and is composed of a host determining the lifespan of the organic matter and an impurity (dopant) determining the color sense and efficiency. This just describes the basic structure of the organic layer 280 include in the OLED panel. The present invention is not limited to the layer structure or material, etc., of the organic layer 280.

The organic layer 280 is inserted between an anode (not shown) and a cathode (not shown). When the TFT becomes an on-state, a driving current is applied to the anode and the electron holes are injected, and the electrons are injected to the cathode. Then, the electron holes and electrons move to the organic layer 280 and emit the light.

Up to now, the touch position detection by the touch sensor panel 100 according to the embodiment of the present invention has been described. Additionally, through use of the touch sensor panel 100 according to the embodiment of the present invention, it is possible to detect the magnitude of the touch pressure as well as whether the touch has occurred or not and/or the touch position. Also, apart from the touch sensor panel 100, it is possible to detect the magnitude of the touch pressure by further including the pressure detection module which detects the touch pressure. Hereafter, the touch pressure detection using the pressure detection module will be described in detail.

In the touch sensor panel 100 according to the embodiment of the present invention, the touch position can be detected through the above-described touch sensor panel 100, and the touch pressure can be detected by disposing the pressure detection module 400 between the display module 200 and a substrate 300.

Hereinafter, the touch pressure detection by the pressure detection module 400 of the touch input device 1000 according to the embodiment of the present invention, and the structure thereof will be described.

Figure 4A:
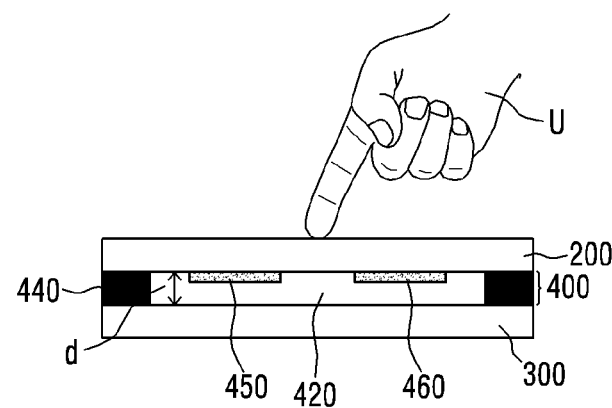
FIGS. 4a and 4b are views for describing a method for detecting a touch pressure on the basis of a mutual capacitance change amount in the touch input device according to the embodiment of the present invention.
Figure 4B:
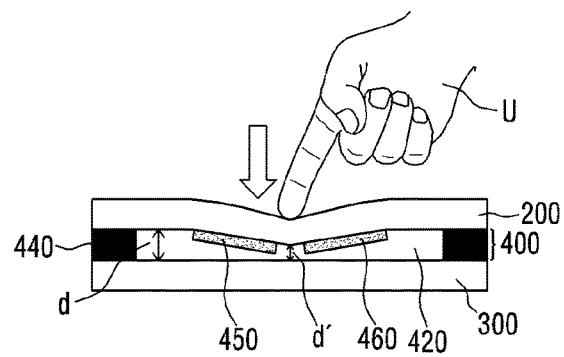

FIGS. 4*a* and 4*b* show a method and structure for performing the touch pressure detection by detecting the mutual capacitance change amount. The pressure detection module 400 shown in FIGS. 4*a* and 4*b* includes a spacer layer 420 composed of, for example, an air-gap. In another embodiment, the spacer layer 420 may be composed of an impact absorbing material or may be filled with a dielectric material.

The pressure detection module 400 may include a pressure electrode 450 and 460 located within the spacer layer 420. Here, the pressure electrode 450 and 460 may be formed under the display module 200 in various ways. This will be described below in more detail. Since the pressure electrode 450 and 460 is included in the rear side of the display panel, the pressure electrode 450 and 460 can be made of any one of a transparent material or an opaque material.

In order to maintain the spacer layer 420, an adhesive tape 440 with a predetermined thickness may be formed along the circumference of the upper portion of the substrate 300. The adhesive tape 440 may be formed on the entire circumference of the substrate 300 (e.g., four sides of a quadrangle) or may be formed on some of the circumference. For example, the adhesive tape 440 may be attached to the top surface or to the bottom surface of the display module 200. The adhesive tape 440 may be a conductive tape in order that the substrate 300 and the display module 200 have the same electric potential. Also, the adhesive tape 440 may be a double adhesive tape. In the embodiment of the present invention, the adhesive tape 440 may be made of an inelastic material. In the embodiment of the present invention, when a pressure is applied to the display module 200, the display module 200 may be bent. Therefore, the magnitude of the touch pressure can be detected even though the adhesive tape 440 is not transformed by the pressure.

As shown in FIGS. 4a and 4b, the pressure electrode for detecting the pressure includes the first electrode 450 and the second electrode 460. Here, any one of the first electrode 450 and the second electrode 460 may be a drive electrode, and the other may be a receiving electrode. A drive signal is applied to the drive electrode, and a sensing signal may be obtained through the receiving electrode. When voltage is applied, the mutual capacitance may be generated between the first electrode 450 and the second electrode 460.

FIG. 4b is a cross sectional view of the pressure detection module 400 when a pressure is applied by the object U. The bottom surface of the display module 200 may have a ground potential in order to block the noise. When the pressure is applied to the surface of the touch sensor panel 100 by the object U, the touch sensor panel 100 and the display module 200 may be bent.

As a result, a distance "d" between the pressure electrode pattern 450 and 460 and a reference potential layer having the ground potential may be reduced to "d'". In this case, due to the reduction of the distance "d", fringing capacitance is absorbed in the bottom surface of the display module 200, so that the mutual capacitance between the first electrode 450 and the second electrode 460 may be reduced. Therefore, the magnitude of the touch pressure can be calculated by obtaining the reduction amount of the mutual capacitance from the sensing signal obtained through the receiving electrode.

In the touch input device 1000 according to the embodiment of the present invention, the display module 200 may be bent by the applied pressure of the touch. The display module 200 may be bent in such a manner as to show the biggest transformation at the touch position. When the display module 200 is bent according to the embodiment, a position showing the biggest transformation may not match the touch position. However, the display module 200 may be shown to be bent at least at the touch position. For example, when the touch position approaches close to the border, edge, etc., of the display module 200, the most bent position of the display module 200 may not match the touch position. However, the display module 200 may be shown to be bent at least at the touch position.

Here, the top surface of the substrate 300 may also have the ground potential in order to block the noise. Therefore, in order to prevent the substrate 300 and the pressure electrode 450 and 460 from being short-circuited, the pressure electrode 450 and 460 may be formed on an insulation layer.

Figure 5:
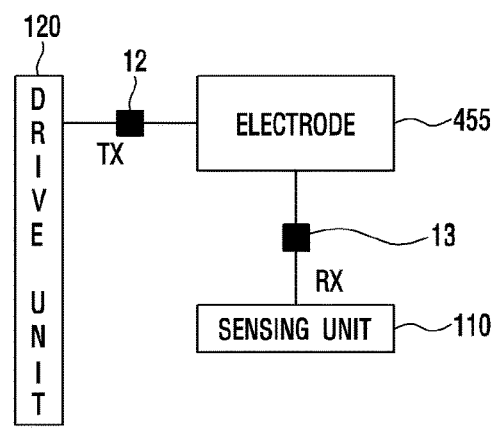
FIG. 5 is a block diagram showing a configuration for detecting the touch pressure on the basis of a self-capacitance change amount in the touch input device according to the embodiment of the present invention.
Figure 6A:
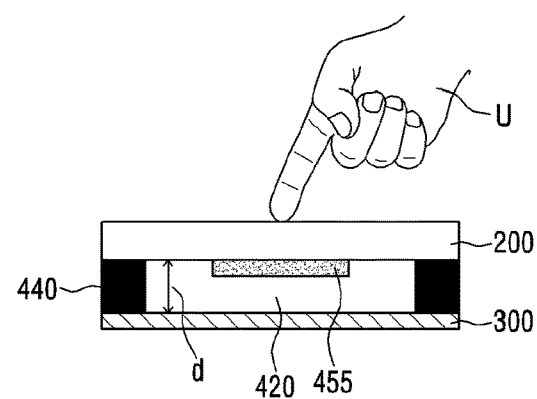
FIGS. 6a and 6b are views for describing a method for detecting the touch pressure on the basis of the self-capacitance change amount in the touch input device according to the embodiment of the present invention.
Figure 6B:
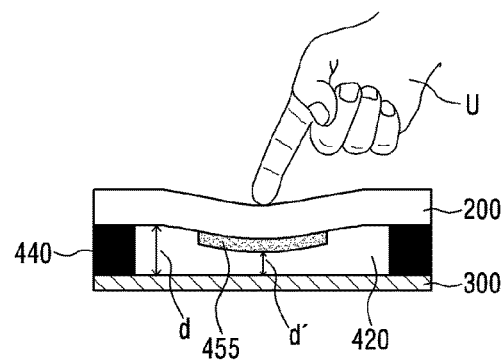

FIGS. 5, 6a, and 6b show a method for detecting the touch pressure by detecting the self-capacitance change amount, and a structure of the same.

The pressure detection module 400 for detecting the self-capacitance change amount uses a pressure electrode 455 formed on the bottom surface of the display module 200. When a drive signal is applied to the pressure electrode 455, the pressure electrode 455 receives a signal including information on the self-capacitance change amount and then detects the touch pressure.

The drive unit 120 applies a drive signal to the pressure electrode 455, and the sensing unit 110 measures a capacitance between the pressure electrode 455 and the reference potential layer 300 (e.g., substrate) having a reference potential through the pressure electrode 455, thereby detecting whether the touch pressure has been applied or not and the magnitude of the touch pressure.

The drive unit 120 may include, for example, a clock generator (not shown) and a buffer, generate a pulse-shaped drive signal, and apply the drive signal to the pressure electrode 455. However, this is just an example. The drive unit may be implemented by means of various elements, and the shape of the drive signal may be variously changed.

The drive unit 120 and the sensing unit 110 may be implemented by an integrated circuit and may be formed on one chip. The drive unit 120 and the sensing unit 110 may constitute a pressure detector.

In order that the capacitance change amount is easily detected between the pressure electrode 455 and the reference potential layer 300, the pressure electrode 455 may be formed such that a larger facing surface between the pressure electrode 455 and the reference potential layer 300. For example, the pressure electrode 455 may be formed in a plate-like pattern.

With regard to the detection of the touch pressure in the self-capacitance type method, here, one pressure electrode 455 is taken as an example for description. However, the plurality of electrodes are included and a plurality of channels are constituted, so that it is possible to configure that the magnitude of multi pressure can be detected according to multi touch.

The capacitance between the pressure electrode 455 and the reference potential layer is changed by the change of the distance between the pressure electrode 455 and the reference potential layer 300. Then, the sensing unit 110 detects information on the capacitance change, and thus the touch pressure is detected.

FIG. 6a is a cross sectional view showing the display module 200 and the pressure detection module 400 in the touch input device 1000.

As with the above-described embodiment of FIGS. 4a and 4b, the pressure electrode 455 may be disposed apart from the reference potential layer 300 at a predetermined distance "d". Here, a material which is deformable by the pressure applied by the object U may be disposed between the pressure electrode 455 and the reference potential layer 300. For instance, the deformable material disposed between the pressure electrode 455 and the reference potential layer 300 may be air, dielectrics, an elastic body and/or a shock absorbing material.

When the object U presses the touch surface (herein, the top surface of the display module 200 or the top surface of the touch sensor panel 100), the pressure electrode 455 and the reference potential layer 300 become close to each other by the applied pressure, and the spaced distance "d" between them becomes smaller.

FIG. 6b shows that the pressure is applied by the object U and then the display module 200 and the pressure detection module 400 are bent downwardly. As the distance between the pressure electrode 455 and the reference potential layer 300 is reduced from "d" to "d'", the capacitance is changed. Specifically, the self-capacitance generated between the pressure electrode 455 and the reference potential layer 300 is increased. The thus generated self-capacitance change amount is, as described above, measured by the sensing unit 110. Through this, it is possible to determine whether or not the touch pressure has been applied and the magnitude of the touch pressure.

As described above, the touch input device 1000 according to the embodiment of the present invention includes the electrode of the touch sensor panel 100, which is for detecting the touch position, and the electrode of the pressure detection module 400 which is for detecting the touch pressure. Specifically, with regard to the touch position detection, there exist the drive electrode and the receiving electrode which detect the mutual capacitance change amount, and the touch electrode (which may be any one of the drive electrode and the receiving electrode) which detects the self-capacitance change amount.

Also, with regard to the touch pressure detection, there exist the drive electrode and the receiving electrode which detect the mutual capacitance change amount, and the pressure electrode (which may be any one of the drive electrode and the receiving electrode) which detects the self-capacitance change amount. Hereinafter, various arrangements and structures of the electrodes included in the touch input device 1000 according to the embodiment of the present invention will be described.

Figure 7:
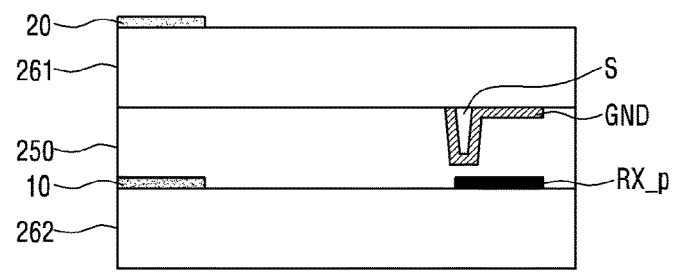
FIG. 7 is a cross sectional vies showing the arrangement of each of the electrodes in the touch input device according to the embodiment of the present invention.

FIG. 7 is a cross sectional vies showing the arrangement of each of the electrodes in the touch input device 1000 according to the embodiment of the present invention. Specifically, in the embodiment of FIG. 7, electrodes 10 and 20 detecting the touch position and an electrode RX_p detecting the touch pressure are provided to the inside of the display module 200 including the LCD panel.

The display module 200 includes the liquid crystal layer 250 between the first glass layer 261 and the second glass layer 262. A spacer S for obtaining a predetermined interval may be provided in the liquid crystal layer 250 of the display module 200. The spacer S can be used as a reference electrode GND by forming a conductive material, e.g., ITO on the spacer S.

The reference electrode GND formed on the spacer S may be spaced apart from the pressure electrode RX_p for detecting the touch pressure by a predetermined interval. Specifically, the pressure electrode RX_p may be the electrode 455 indicated by a reference numeral 455 in FIG. 5. In other words, the pressure electrode RX_p detects the self-capacitance change amount between the reference electrode GND and the pressure electrode RX_p.

Describing in more detail, the drive unit 120 applies a drive signal to the pressure electrode RX_p. The sensing unit 110 measures a capacitance between the pressure electrode RX_p and the reference electrode GND through the pressure electrode RX_p, thereby detecting whether the touch pressure has been applied or not and the magnitude of the touch pressure.

The drive unit 120 may include, for example, a clock generator (not shown) and a buffer, generate a pulse-shaped drive signal, and then apply the drive signal to the pressure electrode RX_p. However, this is just an example. The drive unit may be implemented by means of various elements and the shape of the drive signal can be variously changed.

The drive unit 120 and the sensing unit 110 may be implemented by an integrated circuit and may be formed on one chip. The drive unit 120 and the sensing unit 110 may constitute a pressure detector.

In order that the capacitance change amount is easily detected between the pressure electrode RX_p and the reference electrode GND formed on the spacer S, the pressure electrode RX_p may be formed such that a larger facing surface between the pressure electrode RX_p and the reference electrode GND. For example, the pressure electrode RX_p may be formed in a plate-like pattern.

With regard to the detection of the touch pressure in the self-capacitance type method, here, one pressure electrode RX_p is taken as an example for description. However, the plurality of electrodes are included and a plurality of channels are constituted, so that it is possible to configure that the magnitude of multi pressure can be detected according to multi touch.

The capacitance between the pressure electrode RX_p and the reference electrode GND is changed by the change of the distance between the pressure electrode RX_p and the reference electrode GND. Then, the sensing unit 110 detects information on the capacitance change, and thus the touch pressure is detected.

For this, the pressure electrode RX_p may be, as shown in FIG. 7, disposed within the liquid crystal layer 250 in such a manner as to be spaced apart from the reference electrode GND by a predetermined distance.

When the object U presses the touch surface (herein, the top surface of the display module 200 or the top surface of the touch sensor panel 100), the pressure electrode RX_p and the reference electrode GND become close to each other by the applied pressure, and the spaced distance between them becomes smaller.

Accordingly, the self-capacitance generated between the pressure electrode RX_p and the reference electrode GND is increased. The thus generated self-capacitance change amount is, as described above, measured by the sensing unit 110. Through this, it is possible to determine whether or not the touch pressure has been applied and the magnitude of the touch pressure.

Meanwhile, the drive electrode 10 for detecting the touch position may be formed on the second glass layer 262 within the liquid crystal layer 250. The receiving electrode 20 may be formed on the first glass layer 261. That is, the drive electrode 10 and the receiving electrode 20 are formed in different layers, and the touch position can be detected on the basis of the change amount of the mutual capacitance formed between the drive electrode 10 and the receiving electrode 20. Since this has been described above in detail with reference to FIG. 1a, etc., the description thereof will be omitted.

Here, the second glass layer 262 may be comprised of various layers including a data line a gate line, TFT, a common electrode, and a pixel electrode, etc. These electrical components may operate in such a manner as to generate a controlled electric field and orient liquid crystals located in the liquid crystal layer 250. The drive electrode 10 and the pressure electrode RX_p may use a common electrode included in the second glass layer 262.

Figure 8A:
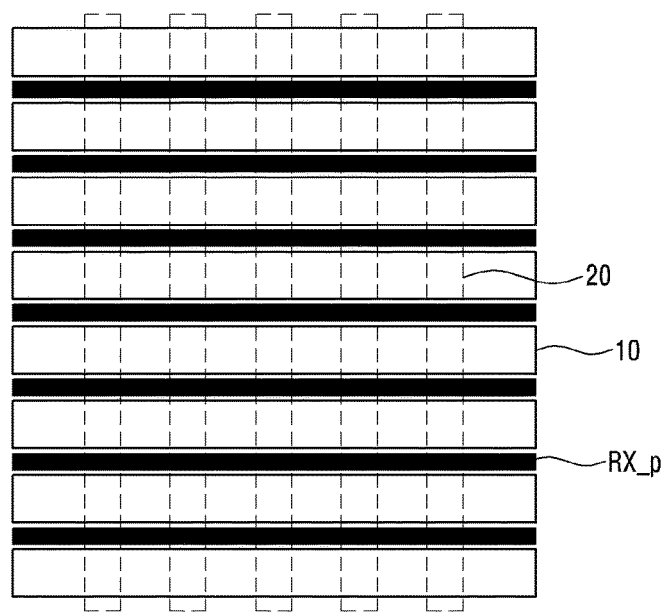
FIG. 8a is a view schematically showing that each electrode has been arranged according to the embodiment of FIG. 7.

FIG. 8a is a view schematically showing that each electrode has been arranged according to the embodiment of FIG. 7.

As shown in FIG. 8a, for the purpose of detecting the touch position, provided are the drive electrode 10 of the liquid crystal layer 250, which is formed on the second glass layer 262, and the receiving electrode 20 formed on the first glass layer 261.

The pressure electrode RX_p for detecting the touch pressure may be formed in the same layer in which the drive electrode 10 is formed, that is, may be formed on the second glass layer 262 within the liquid crystal layer 250. Here, as viewed from the top, the pressure electrode RX_p may be, as shown in FIG. 8a, placed between the plurality of drive electrodes 10. In other words, the pressure electrode RX_p and the drive electrode 10 may be alternately formed in the same layer.

Figure 8B:
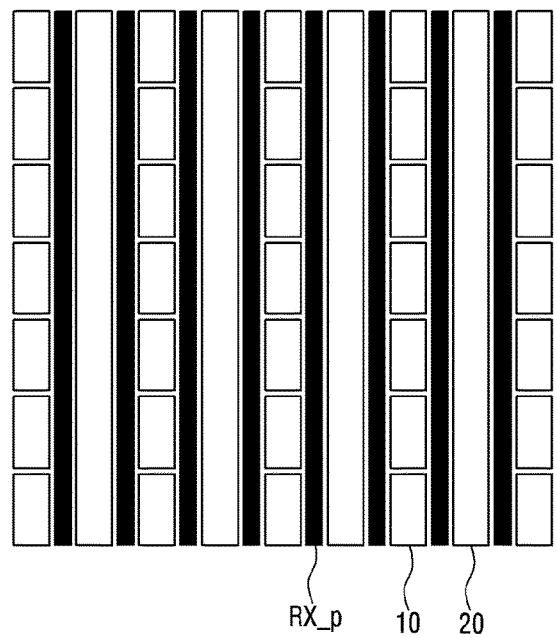
FIG. 8b is a cross sectional view showing that the drive electrode and the receiving electrode are formed in the same layer within the display module in the touch input device according to the embodiment of the present invention.

FIG. 8b is a cross sectional view showing that the drive electrode 10 and the receiving electrode 20 are formed in the same layer within the display module 200 in the touch input device according to the embodiment of the present invention. Since the touch position detection in such a structure has been described with reference to FIG. 1c, the description thereof will be omitted.

In the electrode structure of FIG. 8b, the pressure electrode RX_p may be also formed in the same layer (for example, the second glass layer 262) in which the drive electrode 10 and the receiving electrode 20 have been formed.

A capacitance (C) with a predetermined value is formed at each crossing of the drive electrode TX and the receiving electrode RX. When the object U such as a finger, palm, stylus, etc., approaches, the value of the capacitance may be changed. The touch position can be detected based on the capacitance change amount.

Figure 9:
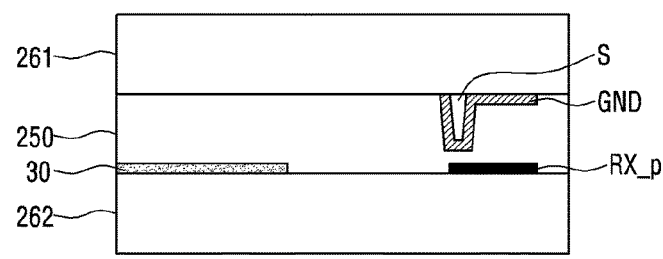
FIG. 9 is a cross sectional view showing the arrangement of each of the electrodes in the touch input device according to another embodiment of the present invention.

FIG. 9 is a cross sectional view showing the arrangement of each of the electrodes in the touch input device according to another embodiment of the present invention. Also, in the embodiment of FIG. 9, the reference electrode GND may be formed on the spacer S. The self-capacitance change amount according to the change of a distance between the reference electrode GND and the pressure electrode RX_p formed separately from the reference electrode GND is detected, so that the touch pressure is detected.

The touch electrode 30 detecting the touch position may be formed on the second glass layer 262 within the liquid crystal layer 250. The drive control signal generated by the controller 130 is transmitted to the drive unit 120. On the basis of the drive control signal, the drive unit 120 applies the drive signal to the predetermined touch electrode 30 for a predetermined time period. Also, the drive control signal generated by the controller 130 is transmitted to the sensing unit 110. On the basis of the drive control signal, the sensing unit 110 receives the sensing signal from the predetermined touch electrode 30 for a predetermined time period. Here, whether the touch has occurred on the touch sensor panel 100 or not and/or the touch position are detected by the sensing signal detected by the sensing unit 110. For example, since the coordinate of the touch electrode 30 has been known in advance, whether the touch of the object U on the surface of the touch sensor panel 100 has occurred or not and/or the touch position can be detected.

Figure 10A:
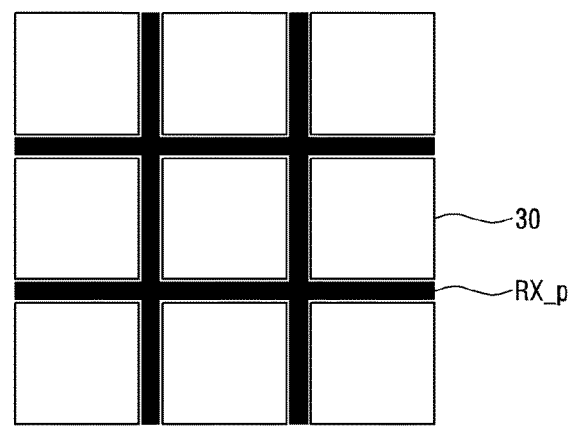
FIGS. 10a and 10b are views schematically showing that each electrode has been arranged according to the embodiment of FIG. 9.
Figure 10B:
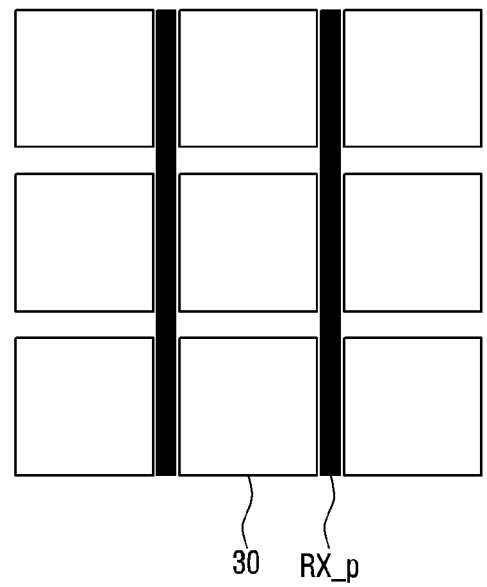

FIGS. 10a and 10b are views schematically showing that each electrode has been arranged according to the embodiment of FIG. 9. That is, the quadrangular touch electrode 30 for detecting the touch position by using the self-capacitance change amount is provided at each grid-shaped crossing at a predetermined interval. However, this is just an example. The shape and arrangement of the touch electrode 30 may be changed.

Here, as with the touch electrode 30, the pressure electrode RX_p may be formed on the second glass layer 262 within the liquid crystal layer 250. The pressure electrode RX_p may be properly disposed in a spaced space between the plurality of touch electrodes 30.

That is, as shown in FIG. 10a, the pressure electrode RX_p may be formed in the spaced space of the plurality of touch electrodes 30 in the form of a cross. Also, as shown in FIG. 10b, the pressure electrode RX_p may be formed only in a vertical line or a horizontal line of the spaced space.

In the meantime, in another embodiment, as with the pressure electrode RX_p, the plurality of touch electrodes 30 shown in FIG. 10a can be used in sensing the pressure. In other words, the touch electrode 30 is able to function as an electrode for sensing not only the touch position but also the touch pressure. As such, when the touch electrode 30 is used as the electrode for sensing the pressure, a larger number of the pressure sensing electrodes are formed, so that reliability is improved and sensitivity is increased. Also, the number of the pressure electrodes RX_p can be reduced, thereby helping to reduce the cost. In this case, the reference electrode is disposed under the plurality of touch electrodes 30, and then the touch pressure can be detected on the basis of the self-capacitance change amount according to the change of a distance between the touch electrode 30 and the reference electrode.

In the descriptions of FIGS. 7 and 9, with regard to the arrangement of the pressure electrode RX_p and the reference electrode GND, it has been described that the pressure electrode RX_p is formed on the second glass layer 262, and the reference electrode GND formed on the spacer S is formed on the first glass layer 261. However, in another embodiment, an arrangement opposite to that above described may be made.

That is, if the reference electrode GND is formed on the spacer S formed on the second glass layer 262 within the liquid crystal layer 250, the pressure electrode RX_p may be formed on the first glass layer 261 within the liquid crystal layer 250.

Also, in FIG. 7, it can be considered that the positions of the drive electrode 10 and the receiving electrode 20 may be interchanged.

Figure 11:
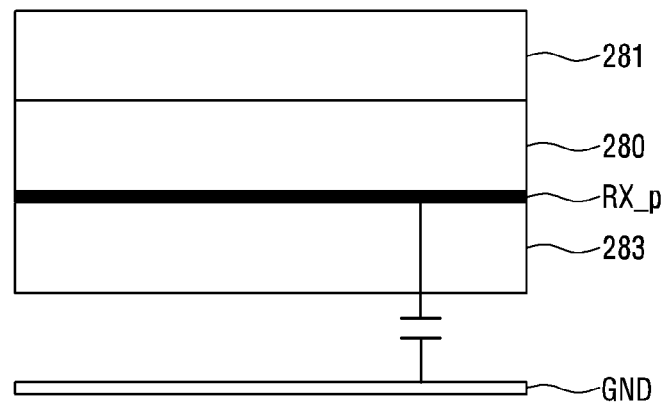
FIG. 11 is a cross sectional view showing that a pressure electrode has been formed within the display module including an OLED panel in the touch input device according to the embodiment of the present invention.

FIG. 11 is a cross sectional view showing that a pressure electrode has been formed within the display module 200 including an OLED panel in the touch input device according to the embodiment of the present invention. As shown in FIG. 11, the OLED includes the organic material layer 280 between the first glass layer 281 and the second glass layer 283. Here, the pressure electrode RX_p for detecting the touch pressure by the self-capacitance type method may be formed on the second glass layer 283. A light shield (LS) for shielding the light inflow, a gate electrode, a source electrode, a drain electrode, a pixel electrode, etc., can be used as the pressure electrode RX_p. In some cases, the pressure electrode RX_p can be used to detect the pressure by depositing separate metal material. Furthermore, a separate metallic configuration is provided and used to detect the pressure.

In the meantime, although FIG. 11 does not show the drive electrode and the receiving electrode for detecting the touch position, they may be disposed in the form shown FIGS. 3d and 3e. However, there is no limit to this. A skilled person in the art may be able to change the arrangement of the drive electrode and receiving electrode by various methods according to needs.

According to the above-described structure, the touch position detection by the drive electrode and the receiving electrode and the touch pressure detection by the pressure electrode can be separately made, so that the touch position and the touch pressure can be detected at the same time.

The features, structures and effects and the like described in the embodiments are included in one embodiment of the present invention and are not necessarily limited to one embodiment. Furthermore, the features, structures, effects and the like provided in each embodiment can be combined or modified in other embodiments by those skilled in the art to which the embodiments belong. Therefore, contents related to the combination and modification should be construed to be included in the scope of the present invention.

Although embodiments of the present invention were described above, these are just examples and do not limit the present invention. Further, the present invention may be changed and modified in various ways, without departing from the essential features of the present invention, by those skilled in the art. For example, the components described in detail in the embodiments of the present invention may be modified. Further, differences due to the modification and application should be construed as being included in the scope and spirit of the present invention, which is described in the accompanying claims.

The invention claimed is:

1. A touch input device detecting a touch position and a touch pressure, the touch input device comprising:
a first electrode for detecting the touch position;
a second electrode which is formed within a liquid crystal layer and is for detecting the touch pressure;
a reference electrode which is formed apart from the second electrode; and
a first glass layer and a second glass layer which are provided on upper and lower portions of the liquid crystal layer respectively, wherein the second electrode within the liquid crystal layer is formed on one side of the second glass layer and the reference electrode within the liquid crystal layer is formed on the other side of the first glass layer;
wherein the second electrode detects the touch pressure on the basis of a self-capacitance change amount according to change of a distance between the second electrode and the reference electrode.

2. The touch input device of claim 1, wherein the reference electrode is formed on a spacer formed within the liquid crystal, layer.

3. The touch input device of claim 1, wherein the first electrode comprises a drive electrode and a receiving electrode, and wherein the drive electrode is formed in the same layer as that in which the second electrode is formed.

4. The touch input device of claim 3, wherein the second electrode and the drive electrode are alternately formed on a plane.

5. The touch input device of claim 1, wherein the first electrode comprises a drive electrode and a receiving electrode, wherein the drive electrode, the receiving electrode, and the second electrode are formed in the same layer, and Wherein the second electrode is formed on a plane in a spaced space between the drive electrode and the receiving electrode.

6. The touch input device of claim 1, wherein the first electrode detects the touch position on the basis of a mutual capacitance change amount or a self-capacitance change amount.

7. The touch input device of claim 1, wherein the first glass layer comprises color filter glass, and wherein the second glass layer comprises TFT glass.

8. The touch input device of claim 1, wherein the first electrode comprises a drive electrode and a receiving electrode, and wherein the receiving electrode extends in a direction crossing a direction in which the drive electrode extends, or extends in a direction parallel to the direction in which the drive electrode extends.

9. The touch input device of claim 1, wherein the first electrode for detecting the touch position is used to detect the touch pressure on the basis of a self-capacitance change amount according to change of a distance between the first electrode and the reference electrode.

10. A touch input device detecting a touch position and a touch pressure, the touch input device, comprising:
a first electrode for detecting the touch position;
a second electrode which is formed within an organic material layer and is for detecting the touch pressure;
a reference electrode which is formed apart from the second electrode; and
a first glass layer and a second glass layer which are provided on upper and lower portions of the organic material layer respectively, wherein the second electrode within the organic material layer is formed on one side of the second glass layer;
wherein the second electrode detects the touch pressure on the basis of a self-capacitance change amount according to change of a distance between the second electrode and the reference electrode.

11. The touch input device of claim 10, wherein the second electrode is composed of one of a gate electrode, a source electrode, a drain electrode, and a pixel electrode.

* * * * *